United States Patent [19]

Kotaka

[11] 3,911,234

[45] Oct. 7, 1975

[54] KEYBOARD TYPE SWITCH ASSEMBLY HAVING FIXED AND MOVABLE CONTACTS DISPOSED ON FOLDABLE FLEXIBLE PRINTED CIRCUIT BOARD

[75] Inventor: Yasumasa Kotaka, Kawasaki, Japan

[73] Assignee: AMP Incorporated, Harrisburg, Pa.

[22] Filed: June 25, 1974

[21] Appl. No.: 483,179

[30] Foreign Application Priority Data

July 5, 1973 Japan ................................ 48-75944

[52] U.S. Cl. .............. 200/5 A; 174/68.5; 200/86 R; 200/159 B; 200/292; 317/101 F

[51] Int. Cl.[2]. H01H 9/00; H01H 13/02; H02B 1/04

[58] Field of Search .......... 200/1 R, 5 R, 5 A, 16 A, 200/61.54–61.57, 83 B, 83 N, 86 R, 159 R, 159 B, 243, 264, 288, 292, 159; 317/101 C–101 F; 339/17 F; 29/622, 625, 626; 113/119; 174/68.5; 340/365 R; 197/68

[56] References Cited

UNITED STATES PATENTS

| | | | |
|---|---|---|---|
| 3,209,089 | 9/1965 | Weissburg | 200/16 A |
| 3,323,197 | 6/1967 | Millard | 200/86 R X |
| 3,383,487 | 5/1968 | Weiner | 200/292 X |
| 3,617,660 | 11/1971 | Krakinowski | 200/5 R X |
| 3,743,797 | 7/1973 | Hoffman | 200/5 R X |
| 3,745,288 | 7/1973 | Reimer | 317/101 F X |

*Primary Examiner*—James R. Scott
*Attorney, Agent, or Firm*—William J. Keating; Jay L. Seitchik; Frederick W. Raring

[57] ABSTRACT

A switch is formed from a flexible printed circuit folded about an apertured spacer so that contacts on the circuit face through the aperture and are engageable by flexure of the circuit. Suitably the spacer is of elastomer and is multi-apertured to provide a multiple or keyboard switch. The flexible circuit lamina may be provided with a logic device and visual display mounted directly on the lamina for use as an electronic logic device of simplified construction.

4 Claims, 4 Drawing Figures

KEYBOARD TYPE SWITCH ASSEMBLY HAVING FIXED AND MOVABLE CONTACTS DISPOSED ON FOLDABLE FLEXIBLE PRINTED CIRCUIT BOARD

This invention relates to an improved flexible printed circuit switch and more particularly to switch operated electronic logic devices.

A flexible printed circuit switch according to the present invention comprises a flexible printed circuit formed with spaced interconnectible contact portions in which the flexible printed circuit comprises a flexible insulating lamina formed on one surface with the contact portions, the lamina being folded about a spacer formed with an aperture, and the contact portions facing each other through the aperture for movement into and out of engagement through the aperture by flexure of the flexible printed circuit.

Suitably the spacer is formed with a plurality of apertures at each of which respective contact portions face each other.

The invention also includes an electronic logic device incorporating such a switch and in which the flexible printed circuit incorporates circuitry of a logic device and a visual display device mounted on the flexible circuit and contacts for connection to a source of electric energy.

The invention will now be described, by way of example, with reference to the accompanying partly diagrammatic drawings, in which.

Figure 1:
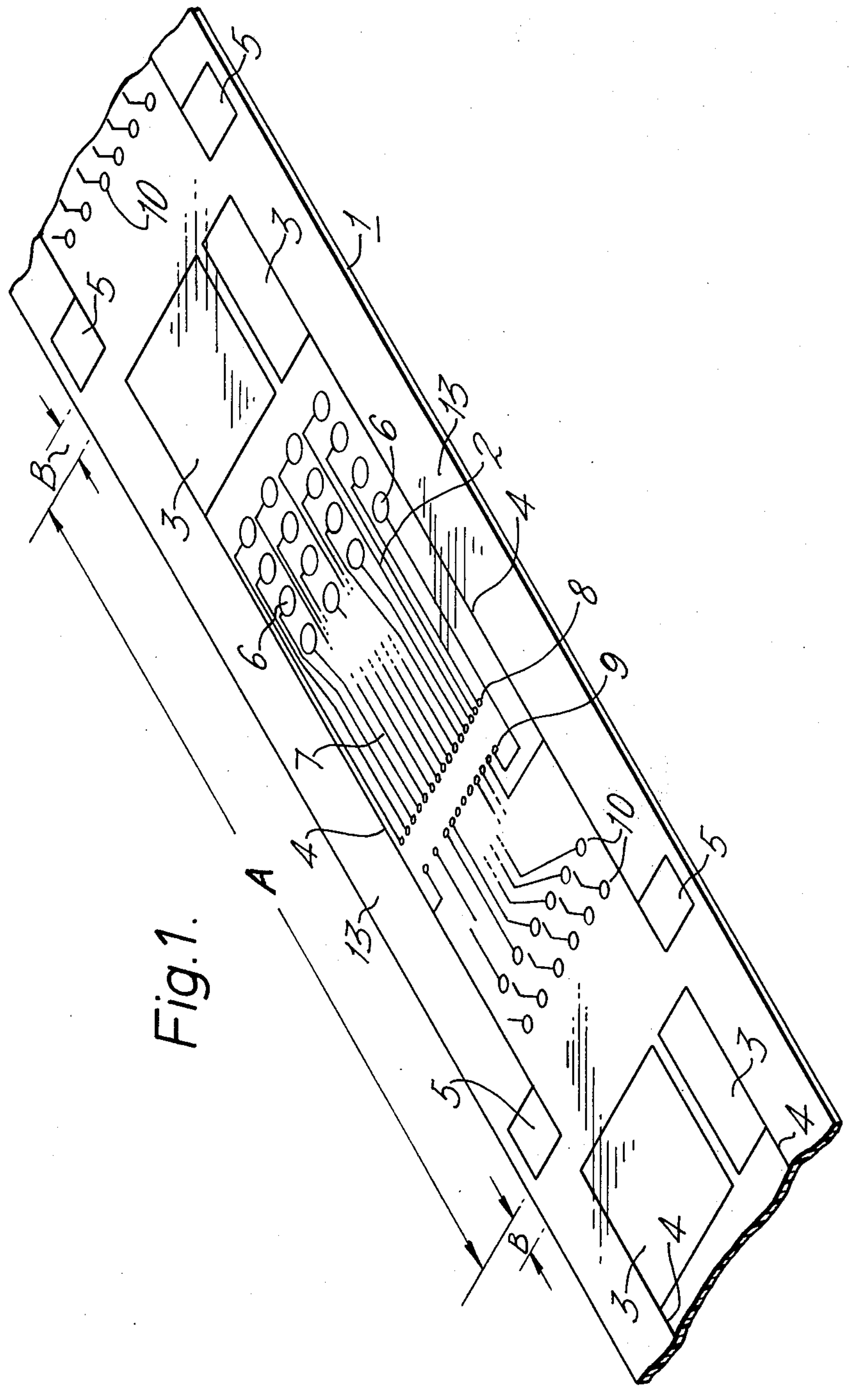
FIG. 1 is a fragmentary perspective view of a continuous flexible printed circuit strip for use in the manufacture of electronic logic devices.

The flexible printed circuit strip of FIG. 1 comprises a substrate 1 of flexible insulating strip suitably formed of heat resistant synthetic resin such as polyimide resin. The strip may be of indefinite length and uniform width and is formed on its upper surface with a series of circuit patterns 2 spaced longitudinally of the strip by known photolithographic techniques. Each pattern extends over a length A—A of the strip and adjacent patterns are spaced by a distance B to allow severing of the strip and separation of adjacent patterns 2.

Each circuit pattern 2 comprises, at the right-hand end as seen in FIG. 1, a pair of rectangular contact zones 3 arranged side-by-side, spaced laterally of the strip 1 and disposed inwardly of the side edges of the strip. Parallel conductive lines 4 extend leftwardly as seen in FIG. 1, from the outer margins of the zones 3 to the left-hand end of the pattern 2 and terminate in contact zones 5 extending outwardly of the lines 4 towards the side edges of the strip.

Leftwardly of the zones 3, and between the lines 4, the circuit pattern 2 comprises a grid array of 16 circular contact zones 6 arranged in four rows of four and each connected to a respective line 7 leading leftwardly to terminate in a first contact row 8 or a second contact row 9 spaced leftwardly of the row 8. Two further contacts of the row 9 are connected to the lines 4 and other contacts extend leftwardly through lines to two further contact rows 10 disposed short of the contact zones 5.

Figure 3:
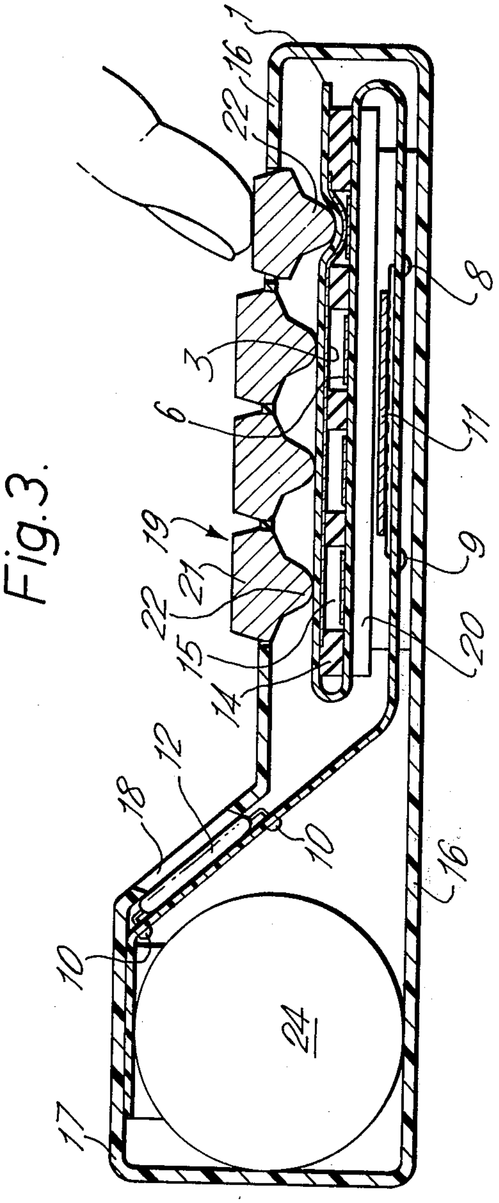
FIG. 3 is a sectional view of the electronic calculator of FIG. 2.
Figure 4:
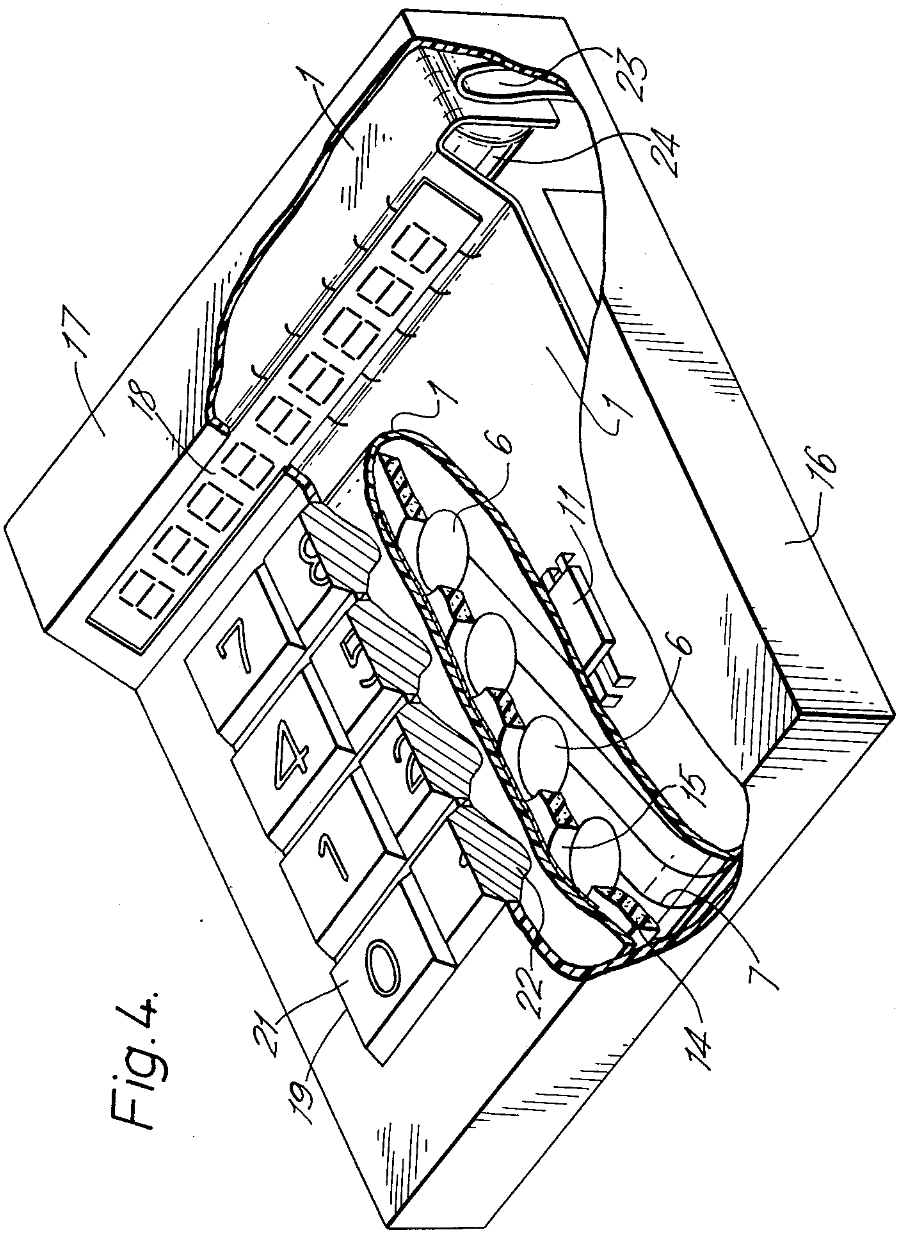
FIG. 4 is a perspective, partially sectioned view of the calculator of FIGS. 2 and 3.

The contact rows 8, 9 are suitably interconnected through an integrated circuit logic element 11, disposed on the reverse side of the strip in FIGS. 3 and 4 by known soldering techniques and the contact rows 10 are suitably interconnected in pairs, also on the reverse side of the strip, through light emitting diode devices. It will be appreciated that the integrated circuit device 11, to be referred to as IC, and the light emitting diode devices 12, to be referred to as LED, of a series of circuit patterns may be mounted on the strip 1 for convenience of bonding during manufacture.

For use in an electronic calculator each circuit pattern is severed from the continuous strip in the regions B, and marginal portions 13 of the strip, outwardly of the lines 4 and between consecutive contact zones 5 are suitably cut away, so that the zones 5 protrude laterally of the residual strip portions.

Figure 2:
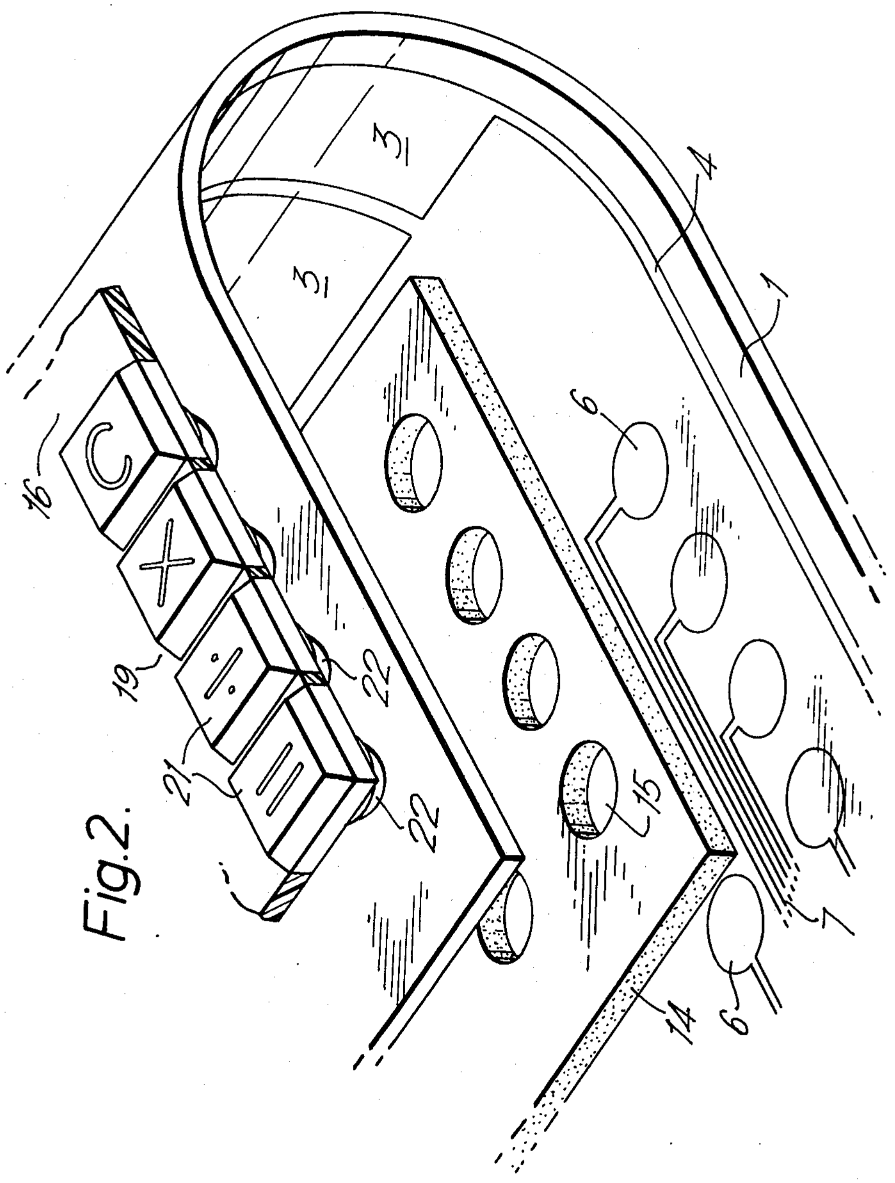
FIG. 2 is a fragmentary perspective partially exploded view of part of an electronic calculator incorporating part of the flexible printed circuit strip of FIG. 1.

The severed strip portion carrying the circuit pattern is then suitably folded as shown in FIG. 2, widthwise of the strip, between the array of contacts 6 and the contact zones 3, with the contacts 6 and zones 3 on the inside of the folded portion on opposite sides of a spacer 14 of resilient insulating material such as a foam rubber. The spacer 14 is formed with an array of apertures 15 corresponding to the array of contacts 6, and as seen in FIGS. 3 and 4, the apertures 15 are registered with respective contacts 6 which face portions of the contact zones 3 through the apertures.

As seen in FIGS. 3 and 4 the flexible circuit strip portion is assembled within a calculator casing 16 comprising a box formed at one end with an enlargement 17 providing a battery compartment and a window 18 exposed over a keyboard 19. The box contains a platform 20 beneath the keyboard 19, and supporting the underside of the folded portion of the flexible circuit strip within which the insulating spacer 14 is disposed. The keyboard comprises 16 push buttons 21, depressibly mounted in apertures in the roof of the box and formed with lower convex protuberances 22 engaging the upper side of the folded circuit portion in alignment with respective apertures 15 of the spacer.

The flexible circuit portion carrying the IC 11 is further folded to extend beneath the platform 20, below which the IC is disposed, and beyond the left-hand end of the platform as seen in FIG. 3, the flexible circuit portion is folded up, past the window 18, at which the LED's 12 are exposed, into the battery compartment 17. As seen in FIG. 4, the spring devices 23 are provided at opposite sides, and the ear-like portions of the flexible circuit carrying contact zones 5 are folded down over respective contact ends of the battery 24, and captivated between the spring devices 23 to maintain contact pressure.

The spring devices 23 and the protuberances 22 also serve to maintain the flexible circuit portion in proper position relative to spacer 14 in the casing 16. Obviously, additional means (not shown) may be provided for suitably securing the flexible circuit portion to the calculator casing to prevent relative lateral movement.

In use, depression of a push button 21 of the keyboard depresses a flexible circuit portion in register with the button protuberance 22, through the associated spacer aperture 15 to engage a circuit zone 3 with a contact portion 6. Compression of the resilient spacer 14 around the aperture, avoids overstress of the flexible printed circuit, and provides a resilient return action for the keyboard button. The described contact engagement energizes and operates a respective logic function of the IC device 11 which in turn controls the LED display 12.

What is claimed is:

1. A flexible printed circuit matrix switch comprising a flexible printed circuit formed of a flexible insulating lamina having first and second spaced interconnectible contact portions on one surface thereof, the first portion comprising a contact zone and the second portion comprising an array of contact areas disposed in a grid, the lamina being folded about a spacer whereby the first and second contact portions are located on opposite sides of the spacer and are facing each other in opposed complementary relation, a plurality of apertures in said spacer disposed in a grid with the apertures being in alignment with the contact areas of said second contact portion, said first and second contact portions being movable into and out of engagement with each other through a selected one of said apertures by flexure of the flexible printed circuit.

2. A flexible printed circuit switch as set forth in claim 1 in which the spacer is of elastomeric insulating material.

3. A flexible printed circuit matrix switch as set forth in claim 1 wherein the first contact portion comprises a relatively large contact zone whereby different portions of said zone are engageable with selected ones of the contact areas of said second contact portion through the apertures in said spacer.

4. A flexible printed circuit matrix switch as set forth in claim 1 wherein said first contact portion comprises a pair of relatively large contact zones, one of said pair being engageable with a part of the array of contact areas of said second contact portion and the other of said pair being engageable with the remainder of the array of contact areas of the second portion.

* * * * *